(12) United States Patent
Jeckeln et al.

(10) Patent No.: US 7,394,311 B2
(45) Date of Patent: Jul. 1, 2008

(54) APPARATUS AND METHOD FOR REDUCED SAMPLE RATE CLASS S RF POWER AMPLIFIER

(75) Inventors: Ernesto Jeckeln, Richardson, TX (US); Breck W. Lovinggood, Garland, TX (US); Michael L. Brobston, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 182 days.

(21) Appl. No.: 11/327,838

(22) Filed: Jan. 6, 2006

(65) Prior Publication Data

US 2006/0188027 A1    Aug. 24, 2006

Related U.S. Application Data

(60) Provisional application No. 60/654,096, filed on Feb. 18, 2005.

(51) Int. Cl.
*H03F 3/38* (2006.01)
*H03K 7/08* (2006.01)

(52) U.S. Cl. ........................................ 330/10; 375/238
(58) Field of Classification Search .................... 330/10
See application file for complete search history.

(56) References Cited

U.S. PATENT DOCUMENTS

| 4,028,633 | A | * | 6/1977 | Rogers et al. | ................ 330/118 |
| 5,392,039 | A | * | 2/1995 | Thurston | .................... 341/143 |
| 6,882,219 | B2 | * | 4/2005 | Leedham | ...................... 330/10 |
| 7,081,793 | B2 | * | 7/2006 | Morris et al. | .................. 330/10 |
| 2002/0097085 | A1 | | 7/2002 | Stapleton | |
| 2004/0047477 | A1 | * | 3/2004 | Bank et al. | .................. 381/120 |
| 2005/0179487 | A1 | * | 8/2005 | Lee et al. | ...................... 330/10 |
| 2006/0094376 | A1 | * | 5/2006 | Lee et al. | .................... 455/118 |

OTHER PUBLICATIONS

Yunfeng Liang et al., "A 250MHz CMOS Bandpass Delta Sigma Modulator Using Continuous-Time Resonator Structure (Short Paper)", 4 pages.
Issac Hsu et al., "A 70-MHz Continuous-time CMOS Band-pass ΣΔ Modulator for GSM Receivers", ISCAS 2000-IEEE International Symposium on Circuits and Systems, May 28-31, 2000, pp. III-750-III-753.
Arun Jayaraman et al., "Bandpass Delta-Sigma Modulator with 800 MHz Center Frequency", 1997 IEEE, pp. 95-98.
J. F. Jensen et al., "A 3.2-Ghz Second-Order Delta-Sigma Modulator Implemented in InP HBT Technology", IEEE Journal of Solid-State Circuits, vol. 30, No. 10, Oct. 1995, pp. 1119-1127.

* cited by examiner

*Primary Examiner*—Robert J. Pascal
*Assistant Examiner*—Krista M Flanagan

(57) ABSTRACT

A Class S RF power amplifier for use in a radio frequency (RF) transmitter. The Class S power amplifier comprises a delta-sigma modulator that receives an analog modulated RF carrier and generates a pulse-width modulated binary signal. The Class S power amplifier also comprises a switch mode power amplifier that receives the pulse-width modulated binary signal generated by the delta-sigma modulator and generates an output carrier signal that switches between a fully on state and a fully off state. The sampling rate of the delta-sigma modulator is less than four times the frequency of the output carrier signal generated by the switch mode power amplifier.

20 Claims, 5 Drawing Sheets

APPARATUS AND METHOD FOR REDUCED SAMPLE RATE CLASS S RF POWER AMPLIFIER

CROSS-REFERENCE TO RELATED APPLICATION AND CLAIM OF PRIORITY

The present application is related to U.S. Provisional Patent No. 60/654,096, filed Feb. 18, 2005, entitled "Reduced Sample Rate Class S RF Power Amplifier". U.S. Provisional Patent No. 60/654,096 is assigned to the assignee of the present application and is hereby incorporated by reference into the present disclosure as if fully set forth herein. The present application hereby claims priority under 35 U.S.C. §119(e) to U.S. Provisional Patent No. 60/654,096.

TECHNICAL FIELD OF THE INVENTION

The present application relates generally to wireless telecommunications and, more specifically, to high efficiency RF power amplifiers.

BACKGROUND OF THE INVENTION

Wireless communication systems implement a variety of radio frequency (RF) power amplifier topologies. The current trend towards highly linear multi-carrier RF transmitters and microwave transmitters having high power efficiency requires more sophisticated circuit topologies, such as class F amplifiers, Doherty amplifiers, and various switch mode RF power amplifier families. Due to the rigorous noise requirements of the new generation wireless systems, some linear power amplifier, such as classes A, AB and B, are forced to operate at low power efficiency, which increase the operating costs of the wireless network. Since power amplifiers consume about 60% of the total power in a transmitter system, highly efficient topologies are need.

With semiconductor technologies pushing clock speeds, switch mode power amplifier (SMPA) systems are becoming an attractive choice over the conventional linear power amplifiers by offering higher efficiency, reduced size, and lower cost. Among switch mode power amplifier topologies, the Class S power amplifier, which is widely used at low frequency, becomes a promising configuration suitable for wireless systems operating at high frequency, such as the new generation base stations using W-CDMA, UMTS, or CDMA2000 air interfaces. Working at a switching frequency higher than the signal frequency, the Class S power amplifier offers a lower harmonic distortion than an amplifier that switches at the signal frequency.

However, the number of available applications of Class S power amplifiers is limited. Many of these applications are directed towards the use of band-pass delta-sigma modulators for either baseband audio applications or intermediate frequency (IF) applications with much lower sample rates than those being considered for the UMTS band and other wireless communication bands. Commercial applications of the bandpass delta-sigma modulator (BP-DSM) are mainly for GSM at intermediate frequency (i.e., IF=70 MHz) and relatively low frequency RF carriers (i.e., RF=250 MHz).

However, many commonly deployed wireless systems operating at 1.9 to 2.1 GHz require a high sampling rate and switching rate of about 8 GHz. To implement a BP-DSM at 8 GHz forces the design out of inexpensive semiconductor processes for implementation. A delta-sigma modulator (DSM) operating at an 8 GHz switching frequency is also more susceptible to parasitic effects that could degrade the loop performance or cause instability. Also, operating a switch mode PA at 8 GHz requires a power device having a high $f_T$. In practical terms, power devices with higher $f_T$ have lower peak operating power. For these reasons, the significant limiting factors in implementing a Class S power amplifier in the 1.9 to 2.1 GHz frequency bands are the cost and performance limitations of implementing circuits with switching frequencies in the 8 GHz range.

Therefore, there is a need in the art for an improved radio frequency (RF) power amplifier for use in wireless communication systems. In particular, there is a need for an improved RF power amplifier for amplifying RF signals with high power-added efficiency.

SUMMARY OF THE INVENTION

An improved Class S RF power amplifier is provided for use in a radio frequency (RF) transmitter. The Class S power amplifier comprises 1) a delta-sigma modulator capable of receiving an analog modulated RF carrier and generating a pulse-width modulated binary signal; and 2) a switch mode power amplifier capable of receiving the pulse-width modulated binary signal generated by the delta-sigma modulator and generating an output carrier signal that switches between a fully ON state and a fully OFF state, wherein a sampling rate of the delta-sigma modulator is less than four times the frequency of the output carrier signal generated by the switch mode power amplifier.

In an advantageous embodiment, the sampling rate of the delta-sigma modulator is four-thirds of the frequency of the output carrier signal generated by the switch mode power amplifier.

According to one embodiment, the delta-sigma modulator is a band-pass delta-sigma modulator.

According to another embodiment, the Class S RF power amplifier further comprises a bandpass filter capable of receiving the output carrier signal generated by the switch mode power amplifier and generating a filter output signal in which out-of-band noise is reduced.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged radio frequency (RF) power amplifier.

The high efficiency Class S radio frequency (RF) power amplifier disclosed herein uses a switch mode RF power amplifier (SMPA) driven by a band-pass delta-sigma modulator (BP-DSM). The delta-sigma modulator converts an analog modulated RF carrier into a pulse-width modulated binary signal. The resulting binary signal drives the switch mode power amplifier between two states, a fully ON state and a fully OFF state. Since the power dissipated in the power amplifier is lowest when operated in the switch mode states, this achieves high power added efficiency in the power stage. A bandpass filter following the SMPA reduces the large amount of out-of-band noise shaped by the BP-DSM. The present disclosure overcomes the problems of conventional RF transmission systems by operating the BP-DSM at a reduced sample rate, which reduces the number of parameters, power consumption, size, and cost yet retains the advantages of the BP-DSM that is operated at a switching speed of 4 times the carrier frequency.

The delta-sigma modulator (DSM) develops an NTF (noise transfer function) notch and an STF (signal transfer function) peak at $f_s/4$ and, according to Nyquist theory, also develops a similar response at $3f_s/4$. Therefore, by reducing the sample frequency, $f_s$, and considering that the output spectrum contains repeated versions of the input signal spectrum, it is possible to find a reduced sample rate, such that the center frequency $f_0$, the NTF notch, and the STF peak remain at the same frequency values. The reduced sample frequency, $f_s'$, may be calculated as follows:

$$f_0 = 3f_s'/4 \Rightarrow f_s' = 4f_0/3 \qquad [\text{Eqn. 1}]$$

For 3G applications at a carrier frequency of 2.14 GHz for example, the reduced sample frequency is 2.8533 Gigahertz (GHz), which eases clock rate restrictions.

Figure 1:
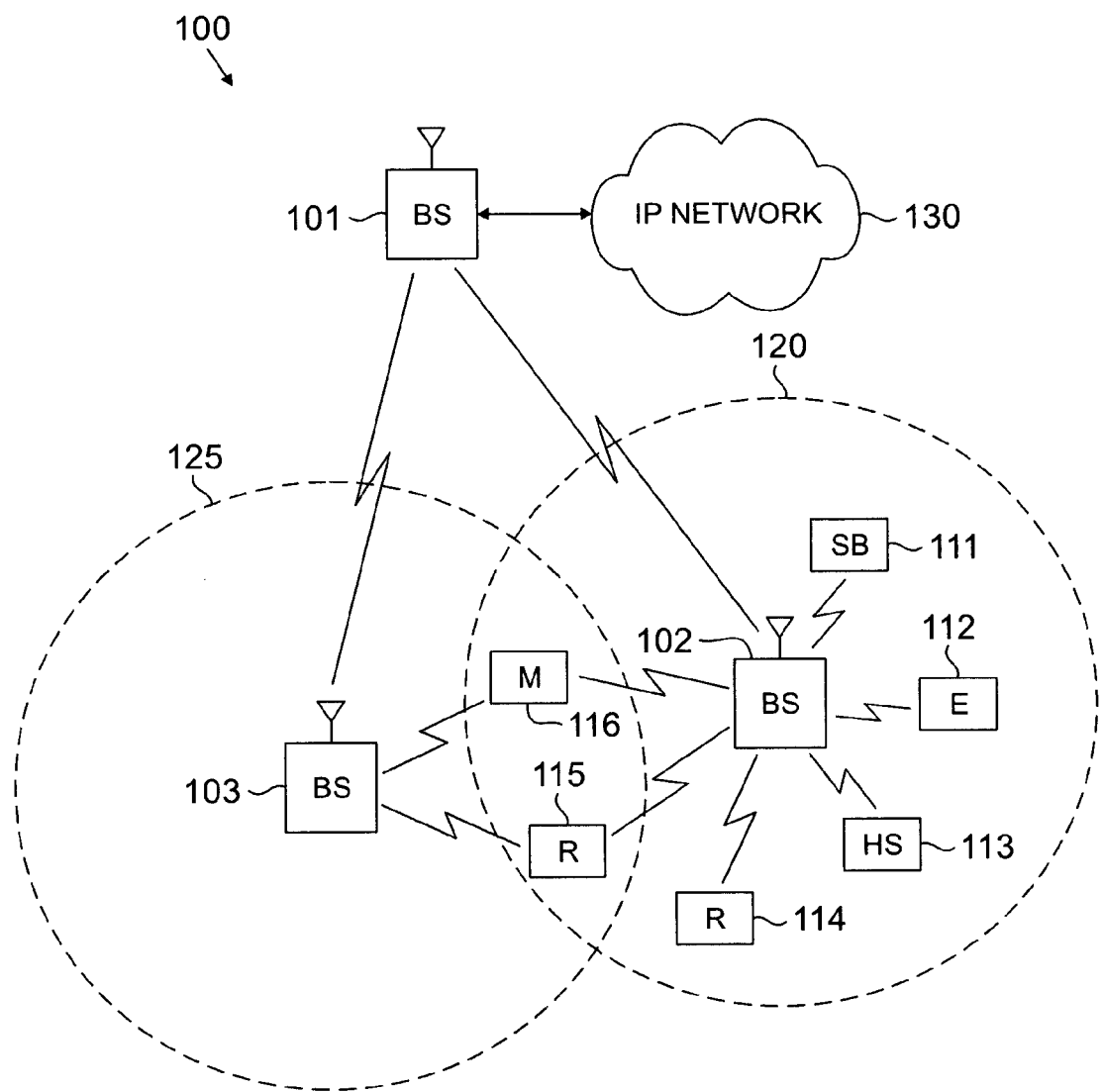
FIG. 1 illustrates an exemplary wireless network that implements switch mode radio-frequency (RF) power amplifiers (SMPA) according to one embodiment of the present disclosure.

FIG. 1 illustrates exemplary wireless network 100, which implements base stations and/or subscriber stations having RF transmitters including switch mode power amplifiers (SMPAs) according to the principles of the present disclosure. In the illustrated embodiment, wireless network 100 includes base station (BS) 101, base station (BS) 102, and base station (BS) 103. Base station 101 communicates with base station 102 and base station 103. Base station 101 also communicates with Internet protocol (IP) network 130, such as the Internet, a proprietary IP network, or other data network.

In the description of wireless network 100, it shall be assumed that wireless network 100 operates according to a multi-carrier standard, such as OFDMA. However, this is by way of illustration only and should not be construed to limit the scope of the present disclosure. It will be understood by those of skill in the art that the SMPA transmitters disclosed herein may readily be adapted for use in a variety of wireless networks and devices, including CDMA, UMTS, GSM, and certain IEEE-802.x systems, among many others.

Base station 102 provides wireless broadband access to network 130, via base station 101, to a first plurality of subscriber stations within coverage area 120 of base station 102. The first plurality of subscriber stations includes subscriber station (SS) 111, subscriber station (SS) 112, subscriber station (SS) 113, subscriber station (SS) 114, subscriber station (SS) 115 and subscriber station (SS) 116. In an exemplary embodiment, SS 111 may be located in a small business (SB), SS 112 may be located in an enterprise (E), SS 113 may be located in a WiFi hotspot (HS), SS 114 may be located in a first residence, SS 115 may be located in a second residence, and SS 116 may be a mobile (M) device.

Base station 103 provides wireless broadband access to network 130, via base station 101, to a second plurality of subscriber stations within coverage area 125 of base station 103. The second plurality of subscriber stations includes subscriber station 115 and subscriber station 116. In alternate embodiments, base stations 102 and 103 may be connected directly to the Internet by means of a wired broadband connection, such as an optical fiber, DSL, cable or T1/E1 line, rather than indirectly through base station 101.

In other embodiments, base station 101 may be in communication with either fewer or more base stations. Furthermore, while only six subscriber stations are shown in FIG. 1, it is understood that wireless network 100 may provide wireless broadband access to more than six subscriber stations. It is noted that subscriber station 115 and subscriber station 116 are on the edge of both coverage area 120 and coverage area 125. Subscriber station 115 and subscriber station 116 each communicate with both base station 102 and base station 103 and may be said to be operating in handoff mode, as known to those of skill in the art.

Figure 2:
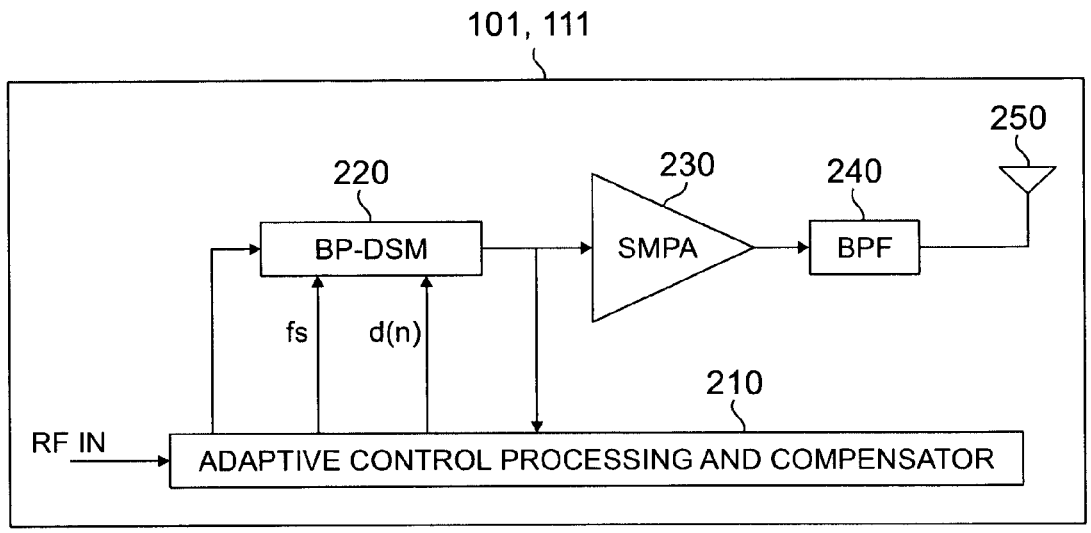
FIG. 2 illustrates selected portions of the radio frequency (RF) transmitter in an exemplary base station (or subscriber station) according to one embodiment of the present disclosure.

FIG. 2 illustrates selected portions of the radio frequency (RF) transmitter in exemplary base station 101 according to one embodiment of the present disclosure. The other base stations in wireless network 100 are similar to base station 101 and need not be described separately. Also, it will be appreciated by those skilled in the art that switch mode power amplifiers according to the principles of the present disclosure are not limited to use in base stations and may be used in other RF equipment as well, including in subscriber stations (or mobile stations, mobile terminals).

The RF transmitter comprises adaptive control processing and compensator block 210, bandpass delta-sigma demodulator (BP-DSM) 220, switch mode power amplifier (SMPA) 230, band-pass filter (BPF) 240 and antenna 250. BP-DSM 220 converts an analog modulated radio frequency (RF) carrier, RF IN, into a pulse-width modulated binary signal. SMPA 230 amplifies the resulting binary signal generated by BP-DSM 220. BPF 240 filters the output of SMPA 230 to reduce the large amount of out-of-band noise shaped by the operation of BP-DSM 220. Adaptive control processing and compensator block 210 performs a dither technique for whitening quantization error and a non-linear distortion compensation technique for nonlinearity compensation.

The transmitter circuitry in FIG. 2 converts the RF IN signal into digital binary pulses using BP-DSM 220 and the pulses drive SMPA 230 amplifier in switch mode fashion (on or off) so that high efficiency is achieved. Thus, waveforms are shaped such that current and voltage transitions do not overlap and only leakage current dissipates when SMPA 230 is off. BPF 240 then removes switching harmonics and shaped noise.

In a Class-S amplifier, the power amplifier stage is no longer the dominant source of distortion. The amplifier non-linearity, the asymmetry of the on and off switching waveforms, and the BP-DSM impairments all contribute to output distortion in a Class S amplifier. To minimize the influence of these factors, the transmitter includes adaptive control processing and compensator block 210 in order to supply stability control, dither, and distortion compensation.

Figure 3:
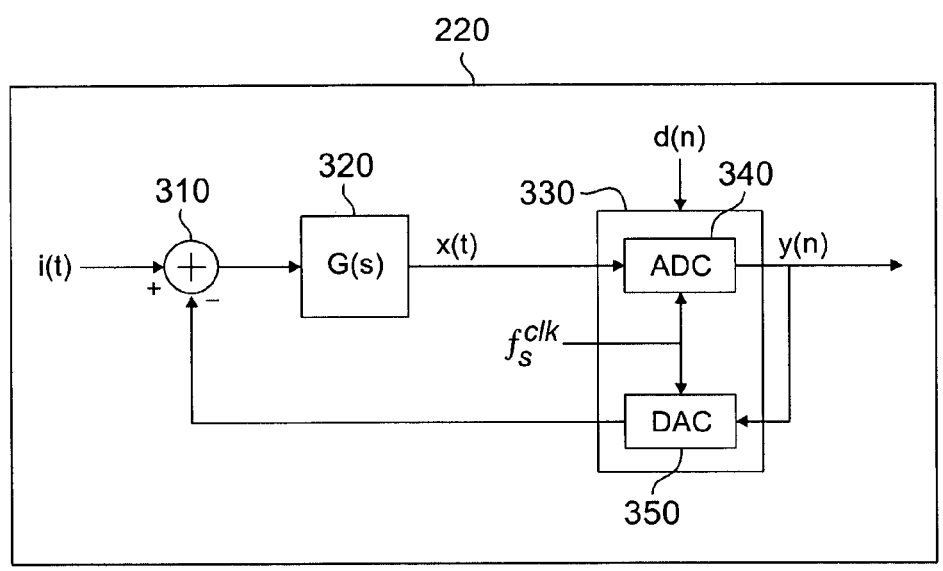
FIG. 3 is a high-level block diagram of a bandpass delta-sigma modulator (BP-DSM) according to one embodiment of the present disclosure.

FIG. 3 is a general block diagram of bandpass delta-sigma modulator (BP-DSM) 220 according to one embodiment of the present disclosure. BP-DSM 220 encodes a time domain signal into a two-level output pulse sequence. The original time domain signal is recovered from the pulse sequence by filtering out of band spectral products at the output of SMPA 230. BP-DSM 220 is a closed-loop feedback system comprising adder 310, loop filter 320, and quantizer block 330. Quantizer block 330 comprises analog-to-digital converter (ADC) 340 and digital-to-analog converter (DAC) 350. The resolution of ADC 340 and DAC 350 may be much lower than the target resolution of the DSM converter. In an exemplary embodiment, ADC 340 may be a simple comparator and DAC 350 may only have two levels.

BP-DSM 220 performs filtering, over-sampling, and error feedback in order to increase resolution. The feedback path controls the input to ADC 340 to make the average output, y(n), look similar to the input i(t). By implementing an appropriate filtering function, G(s), in loop filter 320, the loop gain of BP-DSM 220 may be tailored to shape quantization noise away from the frequency band of the signal being converted. In addition, BP-DSM 220 utilizes over-sampling to spread the quantization noise over a wider frequency range. Combining these three approaches allows a relatively low-resolution ADC, such as ADC 340, to provide high dynamic range conversion.

In an exemplary embodiment, BP-DSM 220 may be a fourth order BP-DSM and may be modified to a higher order without departing from the scope of the present disclosure. The higher the order of BP-DSM 220, the greater the amount of the quantization noise that is pushed out of band. This applies to both continuous time and discrete time architectures. Generally, a continuous time BP-DSM may be first designed as a discrete time BP-DSM due to the ease of analysis and design of the noise shaping characteristics in the discrete time domain. The continuous time BP-DSM is created by transforming the discrete time design using the impulse invariant transformation described by the following equation:

$$Z^{-1}\{G(z)\}=L^{-1}\{R(s)G(s)\}|_{t=nTs} \qquad [\text{Eqn. 2}]$$

where R(s) is the transfer function of DAC 350.

Figure 4:
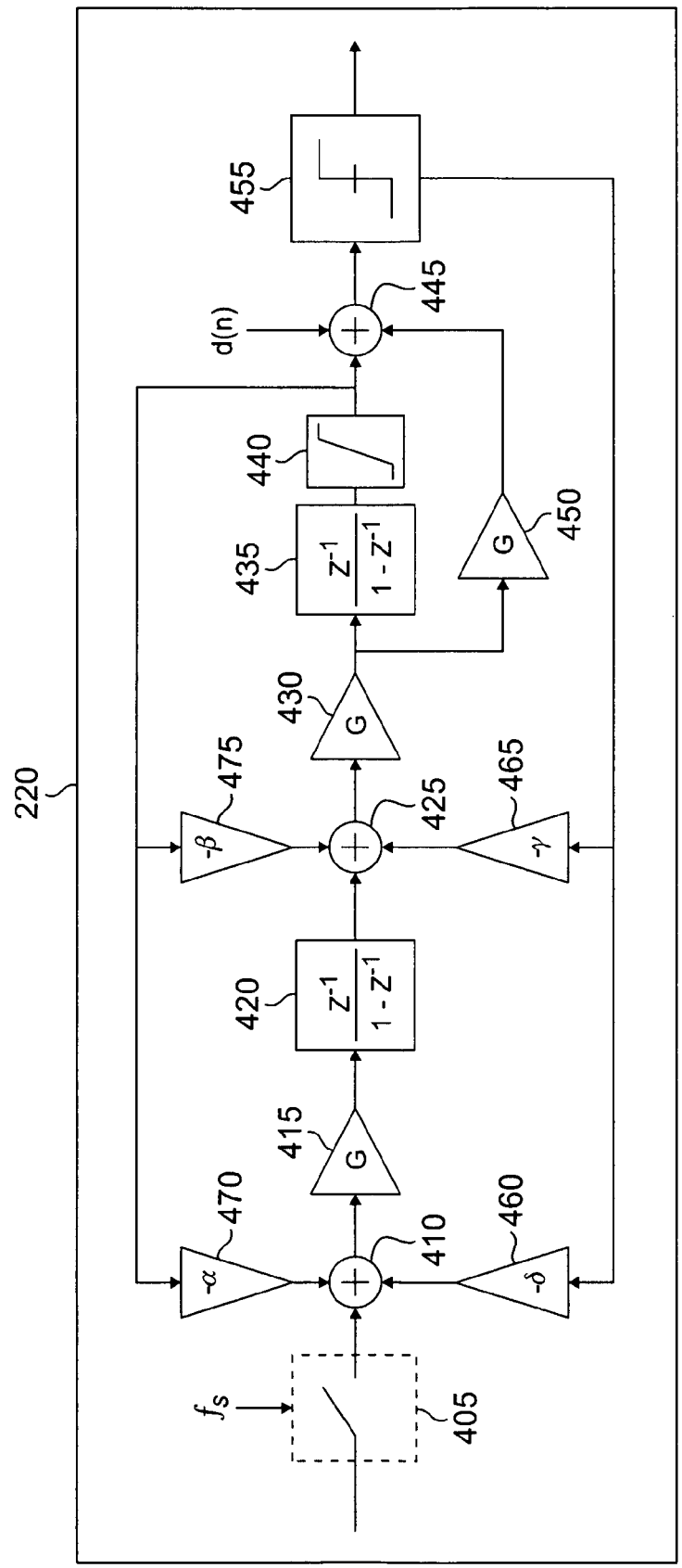
FIG. 4 illustrates an exemplary fourth-order bandpass delta-sigma modulator (BP-DSM) according to one embodiment of the present disclosure.

FIG. 4 is a detailed block diagram of a fourth-order embodiment of BP-DSM 220 with multiple feedback paths according to an exemplary embodiment of the present disclosure. Fourth-order BP-DSM 220 comprises sampling circuit 405, adder 410, amplifier 415, resonator 420, adder 425, amplifier 430, resonator 435, limiter 440, adder 445, amplifier 450, and digital-to-analog converter 455. Fourth-order BP-DSM 220 further comprises feedback elements 460, 465, 470 and 475. In order to increase the performance and affect the stability property, multiple feedback elements 460, 465, 470 and 475 are used. The parameters α, β, γ, δ are optimized for poles and zeros locations and to ensure stability. For stability purposes, fourth-order BP-DSM 220 includes a feed-forward path (i.e., amplifier 450) in conjunction with limiter 440 to ensure stability when high peak levels occur in the last stage.

Considering a sampled data noise model (the ADC can be replaced by the addition of a corresponding quantization error sequence modeled as white noise) and applying the rules of the block diagram algebra, the Z transform of the quantized output signal of BP-DSM 220 may be represented by:

$$Y(z)=X(z)\cdot STF(z)+E(z)\cdot NTF(z) \qquad [\text{Eqn. 3}]$$

where STF is the signal transfer function, NTF is the noise transfer function, and E(z) represents the quantization noise.

STF is designed to have a flat response and, in order to minimize the quantization noise, E(z), the NTF transfer function is designed to have a high attenuation in the signal band. As mentioned above, most band-pass delta-sigma modulators are clocked at a sample frequency, $f_s$, that is four (4) times the carrier frequency, $f_0$. As a result, all of the zeros of NTF fall on top of each other at θ=±π/2. This simplifies the implementation by reducing the number of parameters by half. This reduces power consumption, size, and cost.

BP-DSM 220 offers a number of data conversion benefits for various applications. However, an important consideration is the requirement of the clock frequency for IMT2000 band applications, which may be 8.4 GHz. Conventional band-pass delta-sigma modulators are useful in audio or intermediate frequency applications, but are not viable at the target clock rate of 8.4 GHz. The proposed architecture for the Class S amplifier addresses this issue by operating BP-DSM 220 at a reduced sample rate, while maintaining the advantages of tuning at $f_s/4$.

BP-DSM 220 develops an NTF notch and an STF peak at the frequency $f_s/4$. However, based on Nyquist theory, BP-DSM 220 also develops a similar response at a frequency of $3f_s/4$. By reducing the sample frequency, $f_s$, and taking advantage of the fact that the output spectrum contains repeated versions of the input signal spectrum, it is possible to find a reduced sample rate, $f'_s$, where the center frequency $f_0$, the NTF notch, and the STF peak all occur at the same frequency value. The reduced sample rate, $f'_s$, is calculated using Equation 1 above. For IMT2000 band applications, the sample frequency is at 2.8533 GHz, which eases the clock rate restrictions.

The operation of SMPA 230 requires very wide bandwidth to accommodate square wave amplification, which contains higher order harmonics. Maximum efficiency is achieved when drain voltage and current do not overlap during the ON-OFF or OFF-ON switching transitions. Therefore, it is necessary that the voltage and current waveforms are essentially square waves.

Figure 5:
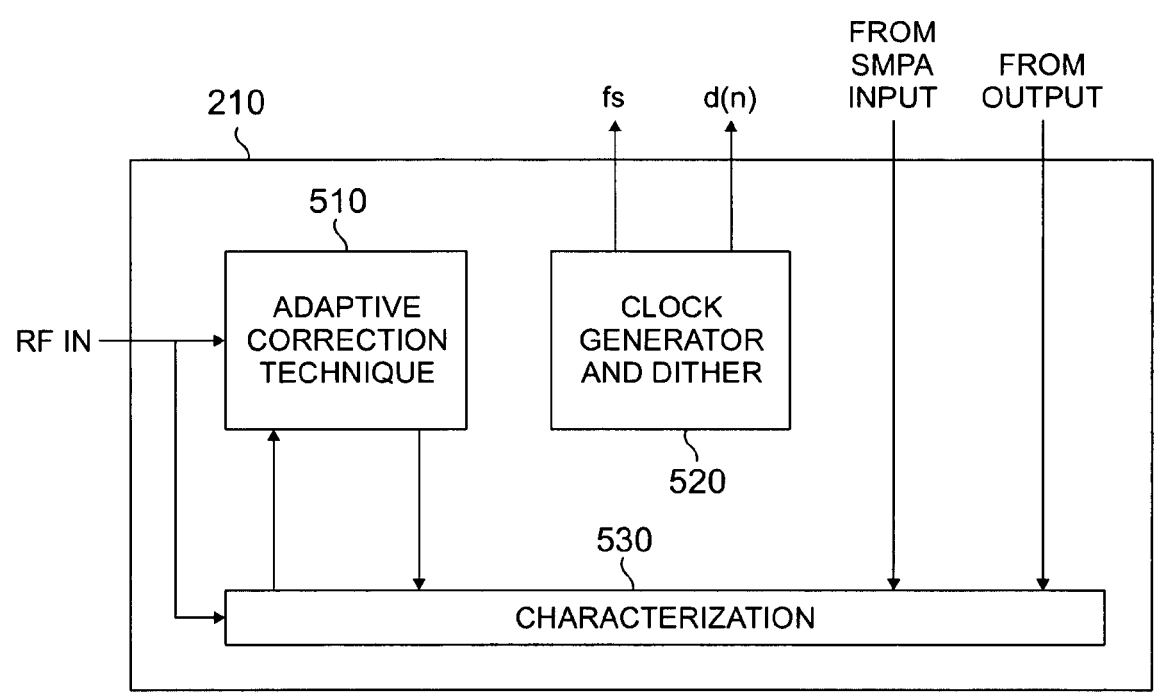
FIG. 5 illustrates an adaptive control processing and compensator block according to one embodiment of the present disclosure.

FIG. 5 illustrates in greater detail adaptive control processing and compensator block 210 according to one embodiment of the present disclosure. Adaptive control processing and compensator block 210 comprises adaptive correction technique block 510, clock generator and dither block 5630, and characterization block 530. In a Class-S power amplifier, the amplifier non-linearity, the asymmetry of the ON-OFF switching waveforms, and the BP-DSM impairments all contribute to output distortion. To minimize these factors, the RF transmitter includes adaptive control processing and compensator block 210 in order to supply stability control, dither, and distortion compensation. Characterization block 530 characterizes the behavior of the Class-S power amplifier in order to supply adaptive correction through adaptive correction technique block 510. By way of example, pre-distortion or feedback techniques may be used. Clock generator and dither block 520 are used for whitening the quantization error.

Several topologies may be used in a switch mode power amplifier 230. The simplest form of a switch mode amplifier is a single field-effect transistor (FET). However, this topology has several limitations. A single FET has non-symmetrical turn ON and turn OFF characteristics, which affect the waveform characteristics as well as the overall amplifier efficiency. In addition, a single FET has different source impedances in the ON and OFF states, which influences the performance of the bandpass filter.

Figure 6:
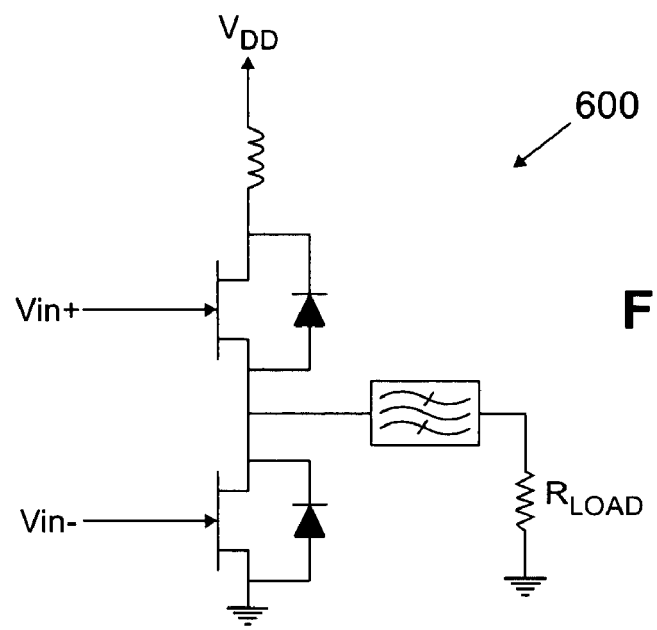
FIG. 6 illustrates an exemplary circuit topology of a switch mode power amplifier according to one embodiment of the present disclosure.

FIG. 6 illustrates exemplary circuit topology 600 of switch mode power amplifier (SMPA) 230 according to one embodiment of the present disclosure. Topology 600 uses two identical FET devices arranged in a totem pole configuration. Topology 600 uses one FET to source the switching current and a second FET to sink the switching current. The main advantage of topology 600 is that it has symmetrical turn ON and turn OFF waveforms.

Figure 7:
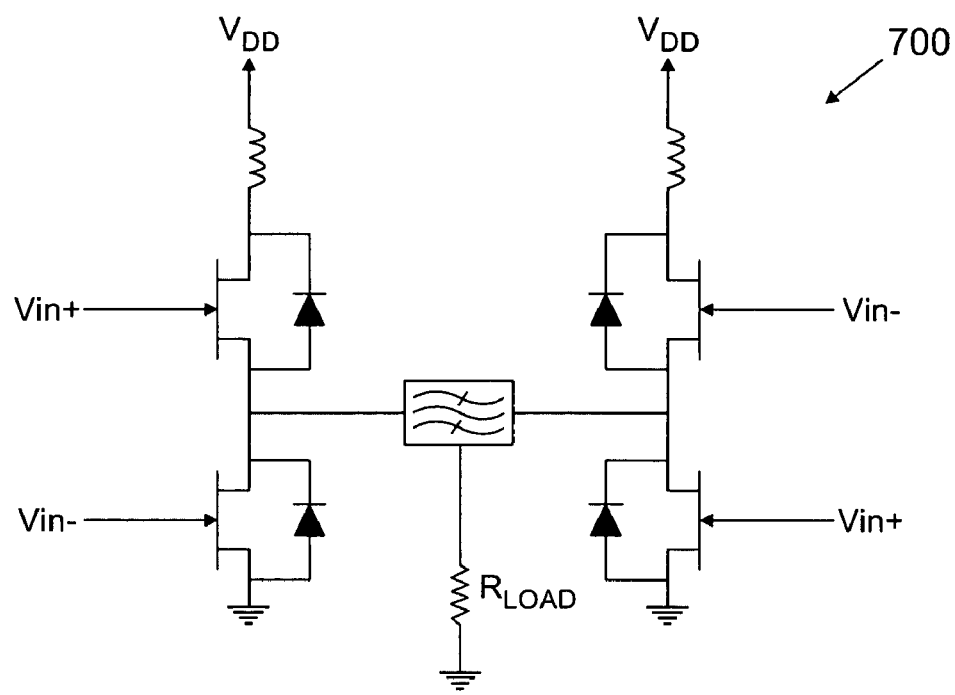
FIG. 7 illustrates an exemplary circuit topology of a switch mode power amplifier according to another embodiment of the present disclosure.

FIG. 7 illustrates exemplary circuit topology 700 of a switch mode power amplifier (SMPA) 230 according to another embodiment of the present disclosure. Topology 700 uses an H-bridge configuration that includes four FET devices arranged in two totem pole circuits with a load connected between the outputs. This approach has symmetry in the turn ON and turn OFF waveforms, like the single totem pole configuration. Additionally, topology 700 has a constant source impedance in both the ON state and the OFF state.

In the proposed architecture, both the DSM and SMPA may be operated at one third the switching frequency used in conventional systems. For a 2.1 GHz carrier, the sampling frequency for the DSM and the switching frequency of the SMPA will be 2.85 GHz, instead of 8.4 GHz. This results in a BPDSM design that may be implemented in a low cost semiconductor process. It also allows use of a power amplifier device that operates at higher power due to the lower frequency. The power amplifier operates at higher efficiency since a much higher percentage of the power amplifier cycle is spent in the non-linear region than in the linear transition region when switched at 2.8 GHz versus 8.4 GHz.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a radio frequency (RF) transmitter, a Class S RF power amplifier comprising:

a delta-sigma modulator capable of receiving an analog modulated RF carrier and generating a pulse-width modulated binary signal; and a switch mode power amplifier capable of receiving the pulse-width modulated binary signal generated by the delta-sigma modulator and generating an output carrier signal that switches between a fully ON state and a fully OFF state, wherein a sampling rate of the delta-sigma modulator is substantially equal to four-thirds of the frequency of the output carrier signal generated by the switch mode power amplifier.

2. The Class S RF power amplifier as set forth in claim 1, wherein the delta-sigma modulator is a band-pass delta-sigma modulator.

3. The Class S RF power amplifier as set forth in claim 2, further comprising a bandpass filter capable of receiving the output carrier signal generated by the switch mode power amplifier and generating a filter output signal in which out-of-band noise is reduced.

4. The Class S RF power amplifier as set forth in claim 2, wherein the switch mode power amplifier comprises a plurality of field effect transistors driven by input waveforms such that overlapping of at least one of drain voltage waveforms and drain current waveforms associated with the plurality of field effect transistors is reduced.

5. The Class S RF power amplifier as set forth in claim 4, wherein the drain voltage waveforms and the drain current waveforms are square waves.

6. The Class S RF power amplifier as set forth in claim 4, wherein the plurality of field effect transistors are arranged in an H-bridge configuration.

7. The Class S RF power amplifier as set forth in claim 1, wherein the Class S RF power amplifier is capable of being implemented in at least one of i) a base station of a wireless communication network and ii) a wireless mobile device capable of accessing the wireless communication network.

8. For use in a wireless network capable of communicating with a plurality of subscriber stations, a base station including a radio frequency (RF) power amplifier, the RF power amplifier comprising:

a delta-sigma modulator capable of receiving an analog modulated RF carrier and generating a pulse-width modulated binary signal; and a switch mode power amplifier capable of receiving the pulse-width modulated binary signal generated by the delta-sigma modulator and generating an output carrier signal that switches between a fully ON state and a fully OFF state, wherein a sampling rate of the delta-sigma modulator is substantially equal to four-thirds of the frequency of the output carrier signal generated by the switch mode power amplifier.

9. The base station as set forth in claim 8, wherein the delta-sigma modulator is a band-pass delta-sigma modulator.

10. The base station as set forth in claim 9, further comprising a bandpass filter capable of receiving the output carrier signal generated by the switch mode power amplifier and generating a filter output signal in which out-of-band noise is reduced.

11. The base station as set forth in claim 9, wherein the switch mode power amplifier comprises a plurality of field effect transistors driven by input waveforms such that overlapping of at least one of drain voltage waveforms and drain current waveforms associated with the plurality of field effect transistors is reduced.

12. The base station as set forth in claim 11, wherein the drain voltage waveforms and the drain current waveforms are square waves.

13. The base station as set forth in claim 11, wherein the plurality of field effect transistors are arranged in an H-bridge configuration.

14. A wireless network comprising a plurality of base stations capable of communicating with a plurality of subscriber stations, wherein each of the base stations comprises:
    a radio frequency (RF) power amplifier comprising:
        a delta-sigma modulator capable of receiving an analog modulated RF carrier and generating a pulse-width modulated binary signal; and
        a switch mode power amplifier capable of receiving the pulse-width modulated binary signal generated by the delta-sigma modulator and generating an output carrier signal that switches between a fully ON state and a fully OFF state, wherein a sampling rate of the delta-sigma modulator is substantially equal to four-thirds of the frequency of the output carrier signal generated by the switch mode power amplifier.

15. The wireless network as set forth in claim 14, wherein the delta-sigma modulator is a band-pass delta-sigma modulator.

16. The wireless network as set forth in claim 15, further comprising a bandpass filter capable of receiving the output carrier signal generated by the switch mode power amplifier and generating a filter output signal in which out-of-band noise is reduced.

17. The wireless network as set forth in claim 15, wherein the switch mode power amplifier comprises a plurality of field effect transistors driven by input waveforms such that overlapping of at least one of drain voltage waveforms and drain current waveforms associated with the plurality of field effect transistors is reduced.

18. The wireless network as set forth in claim 17, wherein the drain voltage waveforms and the drain current waveforms are square waves.

19. The wireless network as set forth in claim 17, wherein the plurality of field effect transistors are arranged in an H-bridge configuration.

20. A method of operating a radio frequency (RF) transmitter comprising the steps of:
    receiving an analog modulated RF carrier in a delta-sigma modulator;
    generating in delta-sigma modulator a pulse-width modulated binary signal;
    receiving the pulse-width modulated binary signal in a switch mode power amplifier; and
    generating in the switch mode power amplifier an output carrier signal that switches between a fully ON state and a fully OFF state, wherein a sampling rate of the delta-sigma modulator is substantially equal to four-thirds of the frequency of the output carrier signal generated by the switch mode power amplifier.

* * * * *